(12) United States Patent
Bennett et al.

(10) Patent No.: US 11,558,964 B2
(45) Date of Patent: Jan. 17, 2023

(54) PROCESS FOR IN-SITU WARPAGE MONITORING DURING SOLDER REFLOW FOR HEAD-IN-PILLOW DEFECT ESCAPE PREVENTION (71) Applicant: INTERNATIONAL BUSINESS MACHINES CORPORATION, Armonk, NY (US)

(72) Inventors: Jennifer I. Bennett, Rochester, MN (US); Steven Chandler Borrillo, Rochester, MN (US); Sarah K. Czaplewski-Campbell, Rochester, MN (US); Eric J. Campbell, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 333 days.

(21) Appl. No.: 16/736,045

(22) Filed: Jan. 7, 2020

(65) Prior Publication Data

US 2021/0212218 A1 Jul. 8, 2021

(51) Int. Cl.
*H05K 3/34* (2006.01)
*H05K 13/08* (2006.01)
(Continued)

(52) U.S. Cl.
CPC ........ *H05K 3/3494* (2013.01); *H05K 1/0271* (2013.01); *H05K 3/1291* (2013.01);
(Continued)

(58) Field of Classification Search
CPC ....... H05K 2203/101; H05K 2203/162; H05K 2203/163; H05K 2203/1121;
(Continued)

(56) References Cited

U.S. PATENT DOCUMENTS

2010/0143656 A1* 6/2010 Zu ................ H05K 2201/09136
228/103
2010/0302749 A1 12/2010 Kao et al.
(Continued)

FOREIGN PATENT DOCUMENTS

JP 2005199286 A 7/2005
JP 2012103785 A * 5/2012

OTHER PUBLICATIONS

R. E. Powell and I. C. Ume, "Development of Warpage Measurement System to Simulate Convective Solder Reflow Process," in IEEE Transactions on Electronics Packaging Manufacturing, vol. 31, No. 1, pp. 83-90, Jan. 2008, doi: 10.1109/TEPM.2007.914220. (Year: 2008).*

(Continued)

*Primary Examiner* — A. Dexter Tugbang
(74) *Attorney, Agent, or Firm* — Cantor Colburn LLP; Tihon Poltavets (57) ABSTRACT

Embodiments of the present invention are directed to an in-situ warpage monitoring system and method for preventing head-in-pillow (HIP) or other potential defect escapes during a solder reflow process. In a non-limiting embodiment of the invention, a product is passed through a reflow oven. The product can include a printed circuit board (PCB). An amount of warpage of the product is measured at one or more monitoring devices positioned along the reflow oven. Each measured amount of warpage is compared to a predetermined warpage limit. The product is sorted into one of a plurality of designated lots based on the comparison. The lots can include a pass lot, a fail lot, and a marginal pass lot.

9 Claims, 4 Drawing Sheets

(51) Int. Cl.
*H05K 1/02* (2006.01)
*H05K 3/12* (2006.01)

(52) U.S. Cl.
CPC ..... *H05K 13/083* (2018.08); *H05K 2203/101* (2013.01); *H05K 2203/1121* (2013.01); *H05K 2203/162* (2013.01); *H05K 2203/163* (2013.01)

(58) Field of Classification Search
CPC .. H05K 3/3494; H05K 13/083; H05K 3/1291; H05K 1/0271; H05K 2201/09136
See application file for complete search history.

(56) References Cited

U.S. PATENT DOCUMENTS

| 2012/0015457 | A1 | 1/2012 | Rawlinson et al. |
| 2014/0043033 | A1 | 2/2014 | Butters et al. |
| 2014/0268603 | A1 | 9/2014 | Hoffmeyer et al. |
| 2017/0181271 | A1 | 6/2017 | Yee et al. |
| 2017/0303450 | A1* | 10/2017 | Okochi ................ H05K 13/083 |

OTHER PUBLICATIONS

Amir, Dudi, Raiyo Aspandiar, Scott Buttars, Wei Wei Chin, and Paramjeet Gill. "Head-and-Pillow SMT Failure Modes." Proceedings SMTAI (2009): 409-421.

Gill, et al., "Defining Package Warpage Criteria To Mitigate Head and Pillow Defects." Paper from SMTAP 2011 Posted and available on line at Researchgate.net; 6 pages.

Hartsough, et al., "Advanced co-planarity measurement tools for the warpage investigation of non-conventional packages caused by reflow and assembly process." In 2007 Proceedings 57th Electronic Components and Technology Conference, pp. 767-772. IEEE, 2007.

Kang, et al., "Techniques for Measuring Warpage ofChip Packages, PWBs, and PWB Assemblies." IEEE Transactions on Components, Packaging and Manufacturing Technology 3, No. 9 (2013): 1533-1544.

Kulteman, et al., "Comparison of advanced package warpage measurement metrologies." In 2016 IEEE 37th International Electronics Manufacturing Technology (IEMT) & 18th Electronics Materials and Packaging (EMAP) Conference, pp. 1-8. IEEE, 2016.

Peng, et al., "Dynamic Warpage Characterization and Reflow Soldering Defects of BGA Packages." In 2016 IEEE 66th Electronic Components and Technology Conference (ECTC), pp. 694-699. IEEE, 2016.

Petriccione, et al., "Warpage studies of HDI test vehicles during various thermal profilings," IEEE Transactions on advanced packaging 22, No. 4 (1999): 624-637.

Powell, et al., "Development of warpage measurement system to simulate convective solder reflow process." IEEE Transactions on Electronics Packaging Manufacturing 31, No. 1 (2008): 83-90.

Rovitto, et al., "Dynamic Warpage Analysis of QFP Packages During Soldering Reflow Process and Thermal Cycle." In 2018 IEEE 68th Electronic Components and Technology Conference (ECTC), pp. 1893-1898. IEEE, 2018.

Tsai, et al., "Comparison between Experimental Measurement and Numerical Analysis of Warpage in PBGA Package and Assembly with the Consideration of Residual Strain in the Molding Compound." In 2006 International Conference on Electronic Materials and Packaging, pp. 1-8. IEEE, 2006.

Vandeveide, et al., "Hidden Head-ln-Piliow soldering failures." In 2014 15th International Conference on Thermal, Mechanical and Mulit-Physics Simulation and Experiments in Microelectronics and Microsystems (EuroSimE), pp. 1-6. IEEE, 2014.

Walwadkar, et al., "In-Situ Surface Mount Process Characterization Using Digital Image Correlation." In MEMS and Nanotechnology, vol. 5, pp. 23-31. Springer, Cham, 2014.

Wang, et al.,"On-Line Measurement of Thermally Induced Warpage of BGAs with High Sensitivity Shadow Moiré," The International Journal of Microcircuits and Electronic Packaging, vol. 21, No. 2, Second Quarter 1998 (ISSN 1063-1674); pp. 191-196.

Yang, et al., "Solder reflow process induced residual warpage measurement and its influence on reliability of flip-chip electronic packages." Microelectronics Reliability 46, No. 2-4 (2006): 512-522.

* cited by examiner

PROCESS FOR IN-SITU WARPAGE MONITORING DURING SOLDER REFLOW FOR HEAD-IN-PILLOW DEFECT ESCAPE PREVENTION

BACKGROUND

The present invention generally relates to fabrication methods and resulting structures for semiconductor devices, and more specifically, to in-situ warpage monitoring of an assembly during the solder reflow process to prevent head-in-pillow (HIP) or other defects from escaping to downstream processes.

Once the formation of semiconductor devices and interconnects on a semiconductor wafer is completed, the semiconductor wafer is diced into individual semiconductor chips. A semiconductor chip, also commonly referred to as an integrated circuit (IC) chip or die, is typically assembled into a semiconductor chip package that is soldered to a printed circuit board during a far back end of line (FBEOL) integration scheme.

The packaging generally provides mechanical protection and electrical connections to an external element. One typical packaging technology is Controlled Collapse Chip Connection (C4) packaging. In C4 packaging a number of round solder bumps ("C4s") are attached to a top surface of each IC chip. The IC chip, via the solder bumps, is soldered to solder pads located along a surface of a package substrate, forming a metallurgical joint between the chip and the substrate. The packaging substrate may then be assembled on a larger circuit board. The combined chip and laminate may be referred to as a module or assembly in some cases. Of course, a module may include other elements, such as a lid.

SUMMARY

Embodiments of the invention are directed to a method for monitoring warpage and preventing HIP defects during a solder reflow process. A non-limiting example of the method includes passing a product through a reflow oven. The product can include a PCB. An amount of warpage of the product is measured at one or more monitoring devices positioned along the reflow oven. Each measured amount of warpage is compared to a predetermined warpage limit. The product is sorted into one of a plurality of designated lots based on the comparison. The lots can include a pass lot, a fail lot, and a marginal pass lot.

Embodiments of the invention are directed to a method for monitoring warpage and preventing HIP defects during a solder reflow process. A non-limiting example of the method includes providing a reflow oven having one or more heating zones. One or more monitoring devices are positioned along the reflow oven. A warpage measurement of a product is taken from the one or more monitoring devices as the product passes through the reflow oven. Each warpage measurement is compared to a predetermined warpage limit. The product is sorted into one of a plurality of designated lots based on the comparison.

Embodiments of the invention are directed to a system for monitoring warpage and preventing HIP defects during a solder reflow process. A non-limiting example of the system includes a reflow oven having one or more heating zones. The system further includes one or more monitoring devices positioned along the reflow oven and a processor configured to perform a plurality of operations. The operations include receiving a warpage measurement of a product from the one or more monitoring devices as the product passes through the reflow oven, comparing each warpage measurement to a predetermined warpage limit, and sorting the product into one of a plurality of designated lots based on the comparison.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagrams or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular reflow system, embodiments of the invention are not limited to the particular architectures or materials described in this specification. Rather, embodiments of the present invention are capable of being implemented in conjunction with any other type of reflow systems now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, a back-end-of-line (BEOL) stage, and a far-back-end-of-line (FBEOL) stage. The process flows for fabricating modern ICs are often identified based on whether the process flows fall in the FEOL stage, the MOL stage, the BEOL stage, or the FBEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another.

During the FBEOL, the semiconductor wafer is diced into individual semiconductor chips and those chips are assembled into semiconductor packages that are mounted to a printed circuit board (PCB). Typically, these packages are soldered to the PCB using solder bumps. A ball grid array (BGA) is one type of surface-mount packaging used for mounting integrated circuits.

In a BGA conductive pads are positioned on the bottom of the package, and each pad is initially covered by a solder ball. These solder balls (also referred to as solder spheres, solder bumps) can be placed manually or by automated equipment. In the conventional process, the package is placed on a PCB with copper pads in a pattern that matches the solder balls. The assembly is then heated, either in a reflow oven or by an infrared heater, melting the balls. Surface tension causes the molten solder on each side of the assembly to melt together, holding the package in alignment with the circuit board at the correct separation distance. The solder is then allowed to cool and solidify, resulting in high quality soldered connections between the device and the PCB.

In some cases, defects occur in the solder interface between the device and the PCB, sometimes as a result of the reflow process. Head-in-pillow (HIP) defects, for example, have become a relatively common failure mode in the industry, specifically since the implementation of Pb-free technologies. The pervasiveness of HIP defects has also been exacerbated by the trend for decreasing pitch of components and usage of larger BGA arrays.

Figure 1:
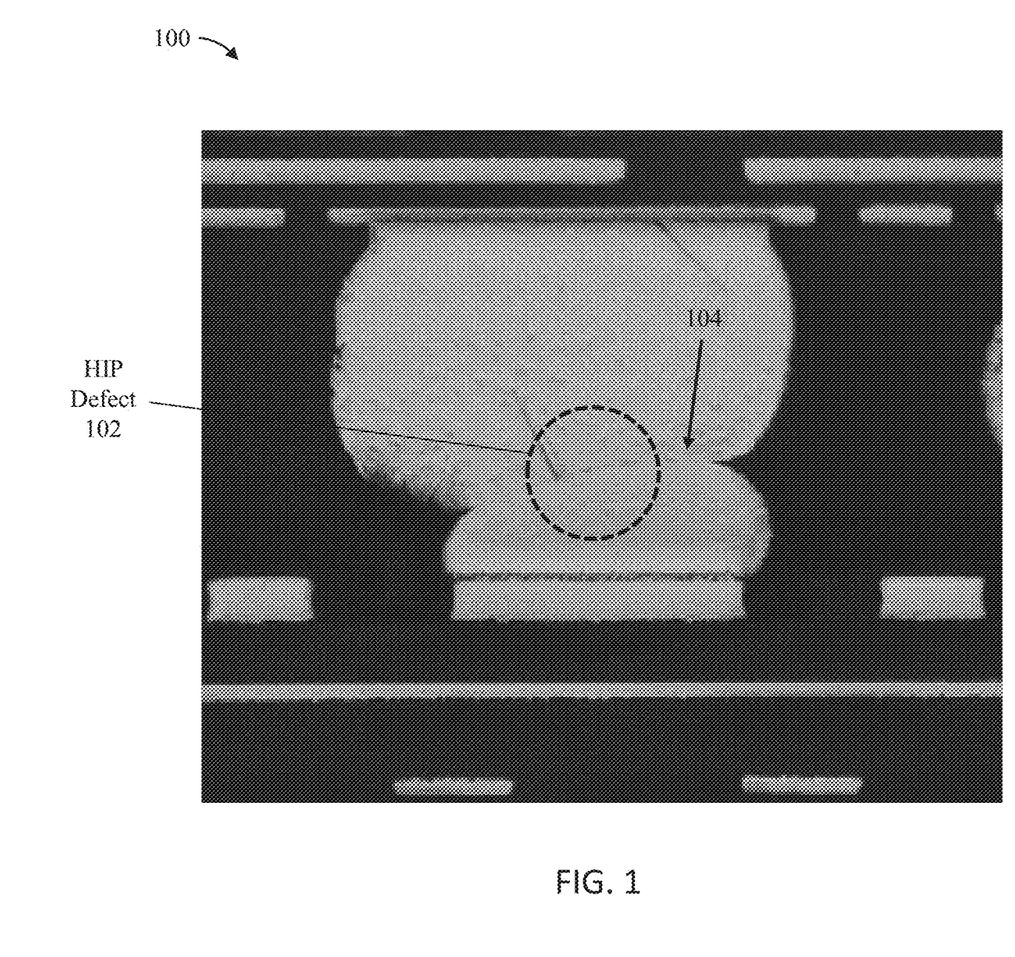
FIG. 1 depicts an example PCB assembly having a HIP defect according to one or more embodiments of the invention.

A HIP defect is the incomplete wetting and coalescence of the entire solder joint, resulting in an open or intermittent electrical connection. In other words, the PCB's solder and the solder ball do not come together to form a solid mass and adequate fillet. HIP defects are characterized as a process anomaly and the majority of HIP defects can be traced back to the reflow process. During reflow, warping of the component (or package) and the PCB can cause the solder balls on the component side to separate from the solder paste on the PCB side, resulting in limited or no wetting. Warpage can cause lifting on one edge, opposite edges (sometimes referred to as a "potato chip" shape), the corners, or the center of the component. An example of a package-PCB assembly 100 having a HIP defect 102 is shown in FIG. 1. As depicted in FIG. 1, in the HIP defect 102 the solder interface between the package-side and PCB-side have not melted together. Instead, a solder boundary 104 runs along the solder interface.

The detection of HIP defects is difficult. Conventionally, HIP defects are monitored using automated x-ray inspection systems. These systems can utilize various algorithms to assess solder joint integrity and can assign each solder joint a "GO" (good) or "NO GO" (bad) rating. However, these methods are not 100% effective as some HIP defects cannot be fully confirmed without the use of a 3D/CT x-ray or manual cross-sectioning, both of which are not available in typical production settings because these techniques are time consuming and cross-sectioning is destructive. This results in HIP defect escapes and latent field failures.

Turning now to an overview of aspects of the present invention, one or more embodiments of the invention address the above-described shortcomings of the prior art by providing a new in-situ warpage monitoring system and method for preventing HIP defects which occur during the solder reflow process from escaping to the field (i.e., to downstream processes). In some embodiments of the invention, in-situ warpage monitoring systems are positioned at various points along the solder reflow process. For example, warpage can be measured at designated critical areas (i.e., positions where package is at room temperature, peak temperature, cool down, etc.) as a PCB assembly moves through a reflow oven.

In some embodiments of the invention, components and PCBs are sorted based on specified warpage limits that can be unique to each given component or PCB. In some embodiments of the invention, these warpage limits correlate to the formation of HIP defects. Warpage limits (also referred to as flatness requirements) can be applied at both initial component attach and for rework processes.

In some embodiments of the invention, in-situ warpage assessments can be achieved utilizing warpage measurement techniques such as precise laser non-contact systems. In some embodiments of the invention, warpage measuring equipment can be mounted to the solder oven to monitor critical components and PCBs as they are heated. If a specified site exceeds the warpage limit, it can be flagged and sorted for further engineering disposition.

Advantageously, combining in-situ warpage monitoring systems with warpage limit component and PCB sorting according to one or more embodiments can reduce the number HIP defect escapes. Consequently, latent field failures related to this defect condition can be reduced or eliminated. Another advantage is a reduction in production time by reducing the requirement for automated x-ray inspection systems. For example, if a part has little to no warpage, that part may be deemed acceptable and not require x-ray-based inspection. Yet another advantage lies in the opportunity to optimize the input reflow variables (e.g., temperature, time, or location) based on the in-situ warpage monitoring data collected, making the reflow process more efficient.

Figure 2:
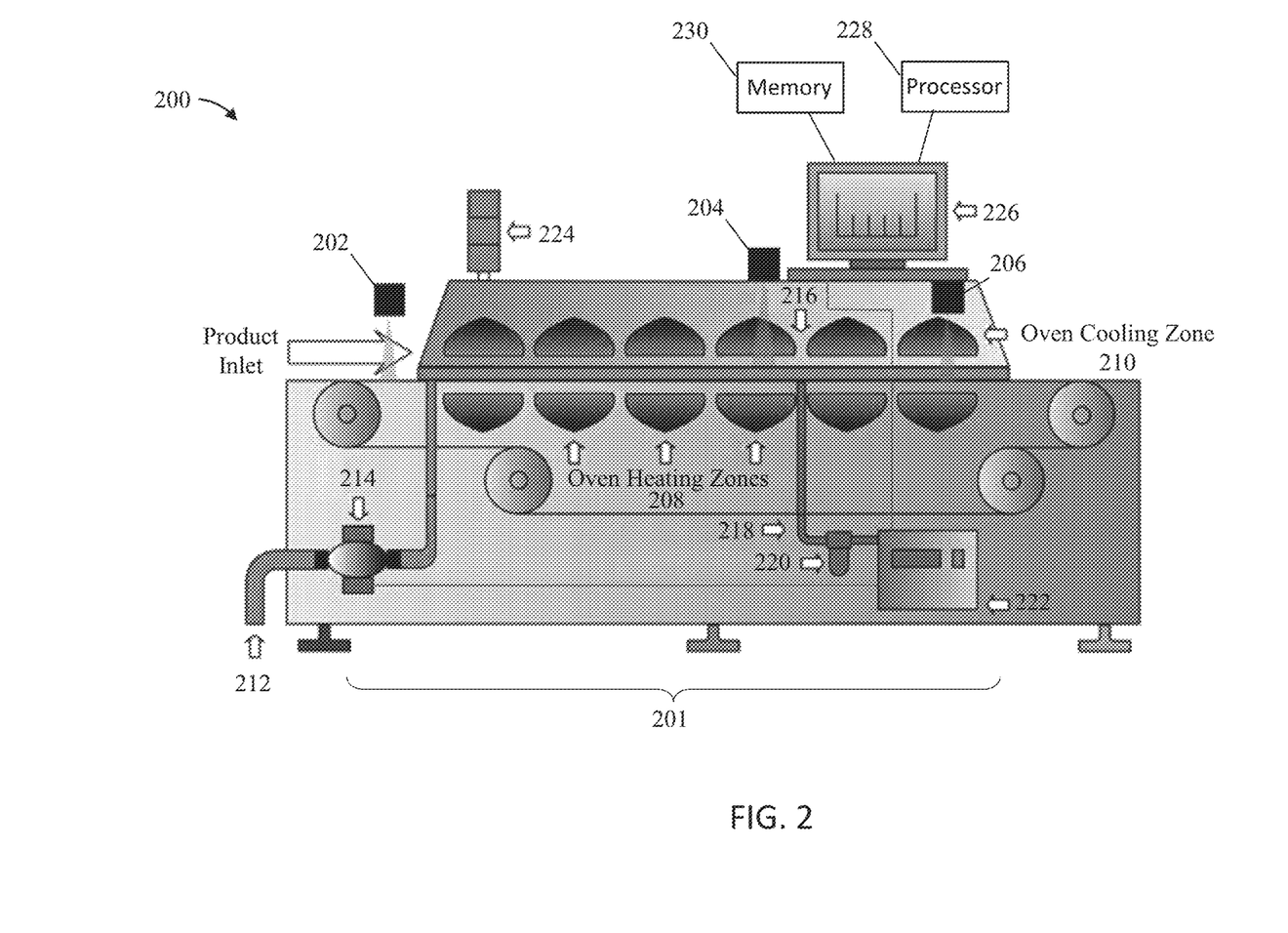
FIG. 2 depicts a cross-sectional view of a reflow oven equipped with an in-situ warpage monitoring system for preventing HIP defects during the solder reflow process according to one or more embodiments of the invention.

Turning now to a more detailed description of aspects of the present invention, FIG. 2 depicts a cross-sectional view of a reflow oven 200 equipped with an in-situ warpage monitoring system 201 for preventing HIP defect escapes from the solder reflow process according to one or more embodiments of the invention. As shown in FIG. 2, the in-situ warpage monitoring system 201 includes a first monitoring device 202 at a first measuring location, a second monitoring device 204 at a second measuring location, and a third monitoring device 206 at a third measuring location.

In some embodiments of the invention, the first measuring location is positioned at the inlet of the reflow oven 200. In this manner, the first monitoring device 202 can measure the incoming warpage of a product (component, package, or combination) at room temperature prior to reflow.

In some embodiments of the invention, the second measuring location is positioned along the oven heating zone 208. In some embodiments of the invention, the second measuring location is at or immediately after the heating zone associated with the peak reflow temperature. In this manner, the second monitoring device 204 can measure the warpage of the product at the portion of the reflow process associated with the highest risk of warpage (e.g., the point of peak reflow temperature).

In some embodiments of the invention, the third measuring location is positioned at or immediately after the oven cooling zone 210. In this manner, the third monitoring device 206 can measure the final warpage of the product after the reflow process has completed.

While an exemplary in-situ warpage monitoring system 201 having three monitoring devices (202, 204, 206) at three particular locations is shown in FIG. 2 for ease of illustration and discussion, it is understood that an in-situ warpage monitoring system having any number of monitoring devices positioned along any portion of the reflow process is within the contemplated scope of the disclosure. For example, the in-situ warpage monitoring system can include more (or less) monitoring devices. In some embodiments of the invention, the in-situ warpage monitoring system can include a monitoring device positioned prior to, at or after any of the oven heating zones. Similarly, several monitoring devices can be distributed along a single oven heating zone or along the oven cooling zone. It should be appreciated that increasing the number of monitoring devices will improve the in-situ warpage monitoring system's ability to precisely determine where in the reflow process warpage is occurring, and to what degree warpage is increasing between measurements (i.e., the effective warpage resolution). The tradeoff, of course, is the increase in costs associated with the additional monitoring devices.

As shown in FIG. 2, the reflow oven 200 can include various components required or useful for the reflow process. The exemplary reflow oven 200 shown in FIG. 2 is provided for ease of discussion. It is understood that an in-situ warpage monitoring system configured for HIP defect escape prevention in accordance with one or more embodiments can be modified for any reflow oven configuration.

In some embodiments of the invention, the reflow oven 200 can include a gas supply 212 (also referred to as a carrier gas supply). In some embodiments of the invention, the gas supply 212 is coupled to a nitrogen gas source. The reflow oven 200 can also include a proportional valve 214 for regulating gas flow, although other gas flow regulators are within the contemplated scope of the invention.

In some embodiments of the invention, the reflow oven 200 includes a gas monitoring sensor 216. In some embodiments of the invention, the gas monitoring sensor 216 is positioned after the peak temperature oven heating zone 208, although other positions are within the contemplated scope of the invention. The gas monitoring sensor 216 can be coupled to a gas inlet tube 218 and a gas filter 220.

In some embodiments of the invention, the gas monitoring sensor 216 is coupled to an oxygen gas analyzer 222. In some embodiments of the invention, the oxygen gas analyzer 222 is a proportional flow control valve (PFC) oxygen gas analyzer, although other systems are possible.

In some embodiments of the invention, the reflow oven 200 includes one or more oven warning lights 224. In some embodiments of the invention, the warning lights 224 can be configured with different colors for indicating different warning conditions (or a normal operating condition). For example, a green light can indicate a normal condition (temperature, warpage amount, etc.) while a red or yellow light can indicate an abnormal condition (e.g., excessive warpage). In some embodiments of the invention, a first light (e.g., yellow light) can indicate that the measured warpage is approaching a threshold (product limit, some percentage of an out of tolerance warpage, etc.) while a second light (e.g., red light) can indicate that a threshold has been exceeded. While the warning lights 224 are shown as stacked at a single location of the reflow oven 200, it is understood that the warning lights 224 can be distributed as desired throughout the reflow process. It is further understood that the warning lights 224 can include more or less indicators. In some embodiments of the invention, one or more warning lights are included prior to, at, or after each of the oven heating zones 208, and prior to, at, or after the oven cooling zone 210.

In some embodiments of the invention, the reflow oven 200 includes an oven management system 226. The oven management system 226 can include processor(s) 228, memory 230, and functionality for controlling the reflow oven 200 during the reflow process. For example, the oven management system 226 can include functionality for controlling the temperature of each of the heating or cooling zones, the speed at which a product is moved through the reflow oven 200, the gas supply rate, or any other aspect of the reflow process.

In some embodiments of the invention, the oven management system 226 is part of or supplemental to the in-situ warpage monitoring system 201. For example, the oven management system 226 can include one or more processors configured to record and monitor the warpage of a product as measured by the in-situ warpage monitoring system 201. The oven management system 226 can include any functionality required by the in-situ warpage monitoring system 201, including, for example, functionality for sorting components based on the measured warpage and predetermined warpage limits. One exemplary scheme for sorting products according to a measured degree of warpage is discussed immediately below.

In some embodiments of the invention, the product (e.g., PCB assembly) moves through the reflow oven 200 with a designated reflow profile. The designated reflow profile can be specific to a particular product, and defines the associated reflow conditions (e.g., the temperature of each of the oven heating zones 208).

During the reflow process, warpage is measured at designated critical areas. In some embodiments of the invention, warpage is measured using monitoring devices positioned along the reflow process (e.g., at locations of room temperature, peak temperature, cool down, etc.) as the PCB assembly moves through the reflow oven, as discussed previously herein.

At the end of the reflow process the warpage data is compared (using, e.g., the oven management system 226) against specified warpage limits for the given component set. In some embodiments of the invention, each product exiting the reflow oven 200 can then be sorted into two or more designations. In some embodiments of the invention, the designations include a pass designation, a marginal pass designation, and a fail designation, although other designations are within the contemplated scope of the invention.

In some embodiments of the invention, the products and parts are sorted for engineering disposition based off a pass/fail warpage criteria (i.e., based off the comparison of the measured warpage to the warpage limit). A "pass" warpage criteria can indicate that the measured warpage is within the acceptable warpage limits, while a "fail" warpage criteria can indicate that the measured warpage is greater than the acceptable warpage limits. In some embodiments of the invention, a "marginal pass" can indicate that the warpage has sufficiently approached the warpage limit (e.g., warpage is within some defined threshold of the warpage limit, such as 80%, 90%, 98%, etc.). A marginal pass can be used to indicate a need for further automated or manual inspection prior to reaching an ultimate decision on product quality and usability.

Some exemplary pass/fail criteria for a BGA site are provided for illustration. It is understood that the specific pass/fail criteria can be changed depending on the requirements of a given application based on empirical evidence.

In some embodiments of the invention, a pass designation is given for a BGA site if the measured warpage is less than or equal to 2.00 mils/inch. In this case, further inspection is not required.

In some embodiments of the invention, a marginal/inspect designation is given for a BGA site if the measured warpage is greater than 2.00 mils/inch and less than 3.00 mils/inch across the BGA site. In some embodiments of the invention, marginal/inspect designations require additional nondestructive inspection (e.g., CT x-ray, AXI, 5Dx) to confirm or deny the presence of any HIP defects.

In some embodiments of the invention, a fail designation is given for a BGA site if the measured warpage is greater than or equal to 3.00 mils/inch across the BGA site. In some embodiments of the invention, this level of warpage is considered excessive warpage and products having the fail designation are sorted for scrap, rework, or further engineering disposition.

As discussed previously herein, to measure warpage, a laser system (such as the Keyence Ultra High Speed In-Line Profilometer LV Series) can be installed at designated areas along the reflow oven 200, for example, as monitoring devices 202, 204, 206. To protect the laser and detection hardware from high temperatures, the hardware can be thermally isolated by a chamber with openings for the laser and an airflow curtain (not shown). The air curtain can utilize laminar airflow projected across the chamber openings. The air curtain can act as a barrier that prevents the hot reflow air from the oven to contact the warpage measurement system. For the example reflow oven 200 shown in FIG. 2, the second monitoring device 204 located at the second measuring location (at peak reflow temperature) would require thermal isolation.

In some embodiments of the invention, the collected data (warpage, temperature, etc.) for each monitoring site can be analyzed and compared to determine a correlation between a shape change of the product and temperature. For example, the change in warpage between adjacent monitoring devices can be correlated to the change in temperature between the monitoring devices. In some embodiments of the invention, a warpage profile can be constructed for a given product and reflow profile. The warpage profile can include, for example, an expected amount of warpage at each monitoring location, based empirically on previous reflows.

Figure 3:
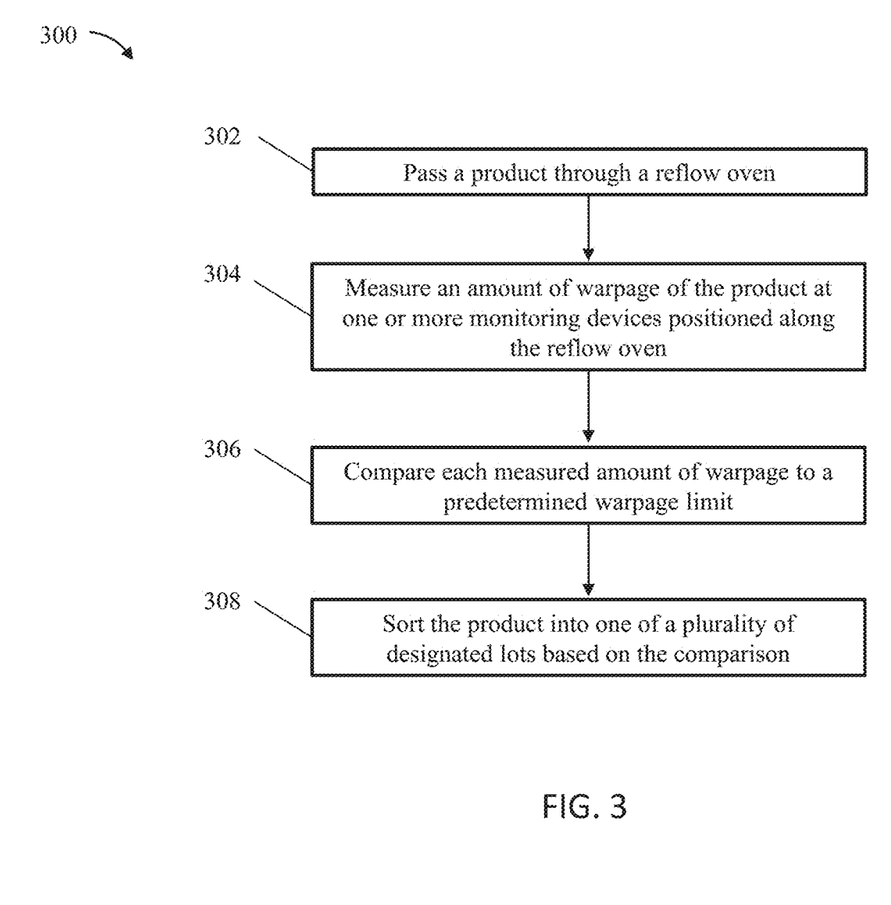
FIG. 3 depicts a flow diagram illustrating a method according to one or more embodiments of the invention.

FIG. 3 depicts a flow diagram 300 illustrating a method for monitoring warpage and preventing HIP defect escapes during a solder reflow process according to one or more embodiments of the invention. As shown at block 302, a product is passed through a reflow oven, such as reflow oven 200 of FIG. 2. In some embodiments of the invention, the product includes a PCB. In some embodiments of the invention, the product includes one or more components coupled to the PCB using a BGA.

At block 304, an amount of warpage of the product is measured at one or more monitoring devices positioned along the reflow oven, such as monitoring devices 202, 204, 206 of FIG. 2. In some embodiments of the invention, the one or more monitoring devices include a first monitoring device positioned at an inlet of the reflow oven. In some embodiments of the invention, the first monitoring device measures a first warpage of the product at room temperature prior to reflow. In some embodiments of the invention, the one or more monitoring devices include a second monitoring device positioned at a heating zone of the reflow oven at which the product reaches a peak reflow temperature. In some embodiments of the invention, the one or more monitoring devices include a third monitoring device positioned at a cooling zone of the reflow oven. In some embodiments of the invention, the third monitoring device measures a final warpage of the product after a reflow process has completed.

At block 306, each measured amount of warpage is compared to a predetermined warpage limit. In some embodiments of the invention, the predetermined warpage limit is associated with the formation of HIP defects.

At block 308, the product is sorted into one of a plurality of designated lots based on the comparison. In some embodiments of the invention, the plurality of designated lots includes a pass lot and a fail lot. In some embodiments of the invention, the plurality of designated lots further includes a marginal pass lot.

The method can further include determining a correlation between warpage and temperature based on each measured amount of warpage and the respective temperature measured at the respective monitoring device.

Figure 4:
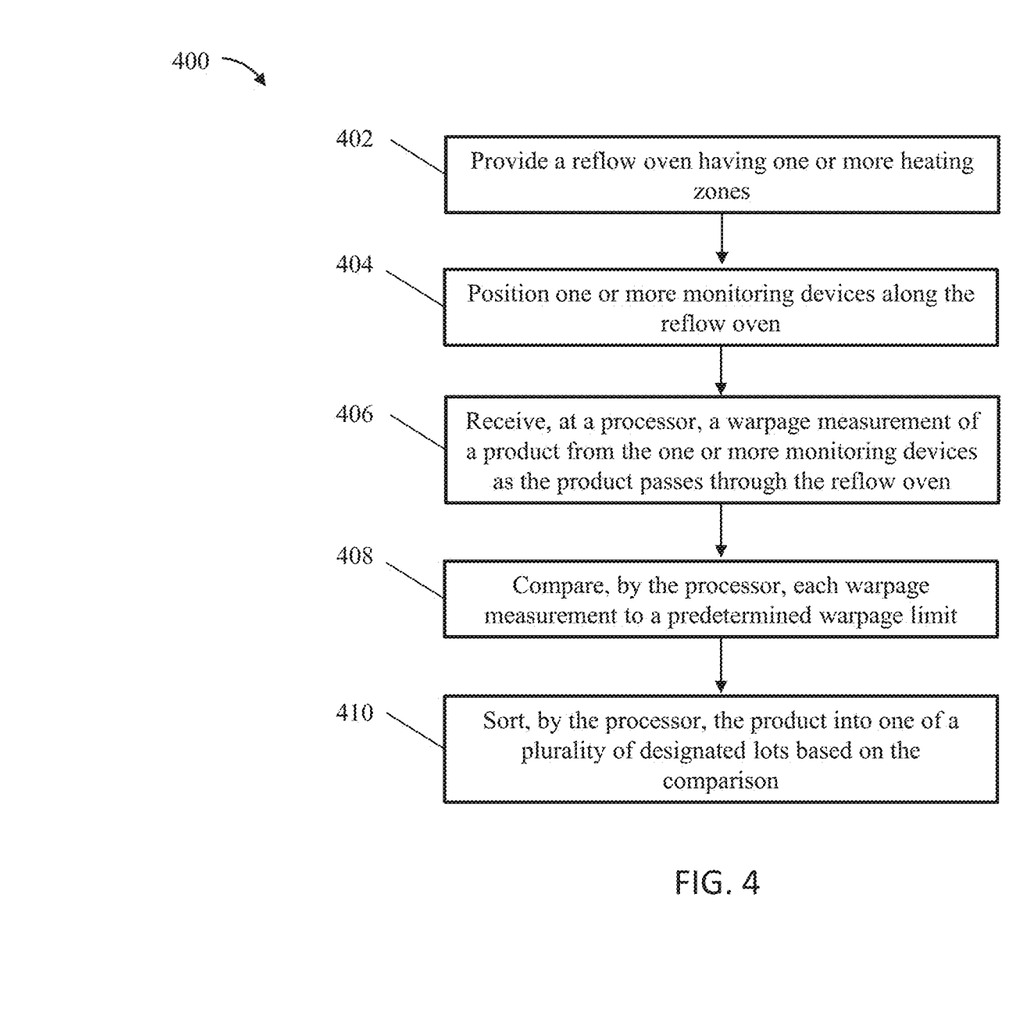
FIG. 4 depicts a flow diagram illustrating a method according to one or more embodiments of the invention.

FIG. 4 depicts a flow diagram 400 illustrating a method for monitoring warpage and preventing HIP defect escapes during a solder reflow process according to one or more embodiments of the invention. As shown at block 402, a reflow oven having one or more heating zones is provided, such as reflow oven 200 of FIG. 2.

At block 404, one or more monitoring devices are positioned along the reflow oven, such as monitoring devices 202, 204, 206 of FIG. 2. In some embodiments of the invention, a first monitoring device is positioned at an inlet of the reflow oven, a second monitoring device is positioned at a heating zone of the reflow oven at which the product reaches a peak reflow temperature, and a third monitoring device is positioned at a cooling zone of the reflow oven.

At block 406, a processor receives a warpage measurement of a product from the one or more monitoring devices as the product passes through the reflow oven. At block 408, the processor compares each warpage measurement to a predetermined warpage limit. At block 410, the processor sorts the product into one of a plurality of designated lots based on the comparison.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:
   providing a reflow oven comprising one or more heating zones;
   positioning one or more monitoring devices along the reflow oven, wherein a first monitoring device is positioned at an inlet of the reflow oven, a second monitoring device is positioned at a heating zone of the reflow oven at which a product reaches a peak reflow temperature, and a third monitoring device is positioned at a cooling zone of the reflow oven;
   receiving, at a processor, a warpage measurement of the product from the one or more monitoring devices as the product passes through the reflow oven;
   comparing, by the processor, each warpage measurement to a predetermined warpage limit; and
   sorting, by the processor, the product into one of a plurality of designated lots based on the comparison.

2. The method of claim 1 further comprising determining, by the processor, a correlation between warpage and temperature based on each warpage measurement and a respective temperature measured at a respective monitoring device of the one or more monitoring devices.

3. The method of claim 1, wherein the product comprises a printed circuit board (PCB).

4. The method of claim 3, wherein the product further comprises one or more components coupled to the PCB using a ball grid array (BGA).

5. The method of claim 1, wherein the first monitoring device measures a first warpage of the product at room temperature prior to reflow.

6. The method of claim 5, wherein the third monitoring device measures a final warpage of the product after a reflow process has completed.

7. The method of claim 1, wherein the predetermined warpage limit is associated with a formation of one or more head-in-pillow (HIP) defects in the product.

8. The method of claim 1, wherein the plurality of designated lots comprises a pass lot and a fail lot.

9. The method of claim 8, wherein the plurality of designated lots further comprises a marginal pass lot.

* * * * *